United States Patent
Chen et al.

(10) Patent No.: US 6,227,867 B1
(45) Date of Patent: May 8, 2001

(54) METHOD FOR PERFORMING DOUBLE-SIDED SMT

(75) Inventors: Spencer Chen, Cypress; Craig Li, Carson, both of CA (US)

(73) Assignee: Hon Hai Precision Ind. Co., Ltd., Taiepi Hsien (TW)

( * ) Notice: Subject to any disclaimer, the term of this patent is extended or adjusted under 35 U.S.C. 154(b) by 0 days.

(21) Appl. No.: 09/244,331

(22) Filed: Feb. 3, 1999

(51) Int. Cl.⁷ .............................. H01R 12/00; H05K 1/00
(52) U.S. Cl. .................... 439/60; 439/59; 29/842; 29/843
(58) Field of Search .............................. 174/260, 138 G; 361/767, 772, 773, 777, 782, 783; 439/59, 60, 61, 62

(56) References Cited

U.S. PATENT DOCUMENTS 3,792,383 * 2/1974 Knappenberger .................... 333/205
5,081,764 * 1/1992 Utunomiya et al. .................... 29/843
5,259,767 * 11/1993 Kurbikoff et al. ....................... 439/59

* cited by examiner

Primary Examiner—Jeffrey Gaffin
Assistant Examiner—Jeremy Norris
(74) Attorney, Agent, or Firm—Wei Te Chung

(57) ABSTRACT

A connector assembly comprises a straddle connector including a dielectric housing having a front face forming an island section and a rear face opposite the island section. Upper and lower rows of terminals are embedded within the housing. Each terminal includes a connecting section extending to the island section and a tail section extending beyond the rear face. A retaining slot is defined between the upper and lower rows of tail sections. A PCB having upper and lower rows of golden fingers is inserted into the retaining slot. Each golden finger of one of the upper and lower rows is coated with solder paste. A row of holes is defined in the PCB adjacent to the golden fingers. Each hole is aligned with the extension of the corresponding terminal and has a solder drop disposed therein.

5 Claims, 2 Drawing Sheets

METHOD FOR PERFORMING DOUBLE-SIDED SMT

FIELD OF THE INVENTION

The present invention relates to a method, and more particularly to a method for performing Surface Mounting Techniques on two sides of a PCB.

DESCRIPTION OF PRIOR ART

A straddle connector includes upper and lower rows of terminals arranged opposite each other with a receiving slot defined therebetween. A PCB having upper and lower golden fingers can be inserted therein and electrical contact is established between the terminals and the corresponding golden fingers. Conventionally, each golden finger is coated with a layer of solder paste which melts when the PCB is passed through an infrared oven. This is generally referred to as an SMT process. However, the SMT process can only be performed on one side of the PCB. After the upper terminals are soldered with the upper golden fingers, the lower terminals must be manually soldered to the lower golden fingers because it is difficult to perform the SMT process on the lower side after the upper side has been completed. In addition, once the upper terminals are soldered to the upper golden fingers, the straddle connector will be tilted upward from a centerline of the PCB thereby further complicating the manual soldering process.

SUMMARY OF THE INVENTION

An objective of this invention is to provide a method for performing SMT on both sides of a PCB.

In order to achieve the objective set forth, a connector assembly comprises a straddle connector including a dielectric housing having a front face forming an island section thereon and a rear face opposite the island section. Upper and lower terminals are embedded within the housing in rows. Each terminal includes a connecting section extending to the island section and a tail section extending beyond the rear face. A retaining slot is defined between the upper and lower rows of tail sections. Each terminal of one of the upper and lower rows has a rearward extension. A PCB having upper and lower rows of golden fingers is inserted into the retaining slot. Each golden finger of one of the upper and lower rows is coated with solder paste. A row of holes is defined in the PCB adjacent to the golden fingers. Each hole is aligned with the extension of the corresponding terminal and has a solder drop disposed therein.

These and additional objects, features, and advantages of the present invention will become apparent after reading the following detailed description of the preferred embodiment of the invention taken in conjunction with the appended drawing.

DETAILED DESCRIPTION OF PREFERRED EMBODIMENT

Figure 1:
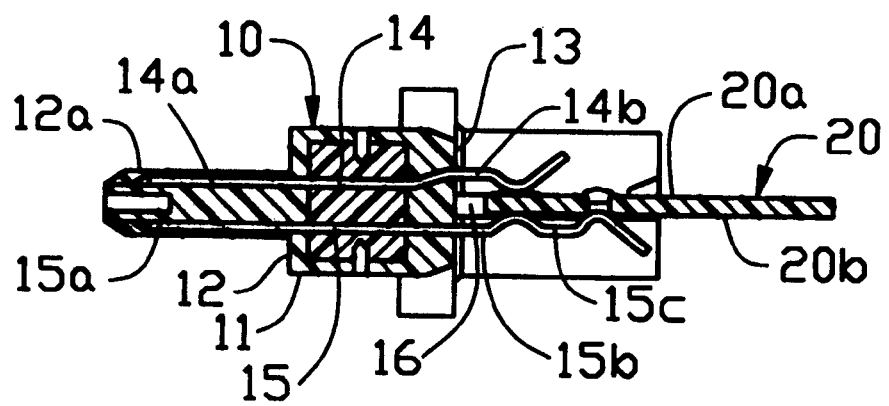
FIG. 1 is a side view of a connector assembly in accordance with the present invention.
Figure 2:
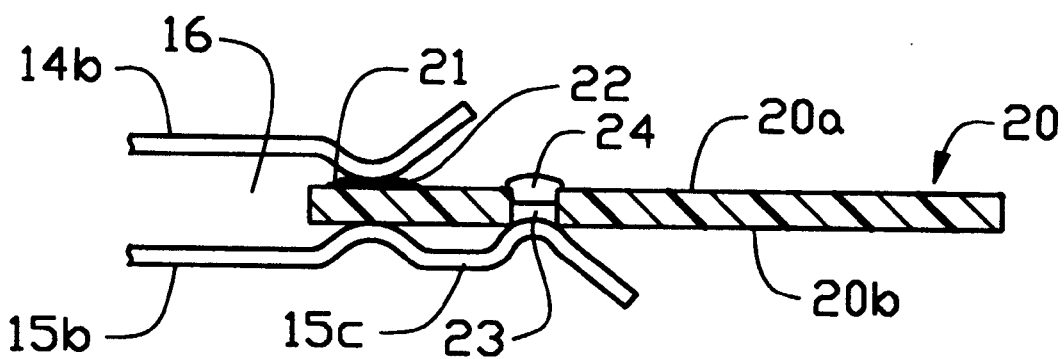
FIG. 2 is an enlarged view showing terminals connecting with a golden finger.

Referring to FIGS. 1 and 2, a connector assembly 1 in accordance with the present invention comprises a straddle connector 10 and a PCB 20. It shall be understood that the present invention is not limited to a straddle connector. The straddle connector 10 includes a dielectric housing 11 having a front face 12 forming an island section 12a and a rear face 13 opposite the island section 12a. Upper and lower rows of terminals 14, 15 are embedded within the housing 11. Each terminal 14, 15 includes a connecting section 14a, 15a extending to the island section 12a and a tail section 14b, 15b extending beyond the rear face 13. A retaining slot 16 is defined between the upper and lower rows of tail sections 14b, 15b. Each lower terminal 15 has a rearward extension 15c.

The PCB 20 is inserted into the retaining slot 16 between the tail sections 14b, 15b. The PCB 20 has an upper face 20a and a lower face 20b. The PCB 20 forms a row of golden fingers 21 on the upper face 20a which electrically connect with the upper terminals 14. Each golden finger 21 is electrically connected to a corresponding conductive lead which is electrically connected to an associated electrical component (not shown). Each golden finger 21 is coated with a layer of solder paste 22 which melts when the PCB 20 and the straddle connector 10 pass through an infrared oven (not shown). In addition, a row of holes 23 is defined in the PCB 20 adjacent to the golden fingers 21. Each hole 23 is provided with a solder drop 24 on the upper face 20a of the PCB 20. Each solder drop 24 melts when the PCB 20 passes through the infrared oven and contacts the rearward extension 15c of the corresponding lower terminal 15. Each hole 23 is electrically connected with the corresponding lead of an associated electrical component (not shown).

When the PCB 20 is inserted into the retaining slot 16 between the tail sections 14b, 15b, a portion of the upper tail section 14b abuts against the corresponding golden finger 21 while a portion of the rearward extension 15c of the lower tail section 15b extends into the hole 23. By this arrangement, when the PCB 20 together with the straddle connector 10 pass through the infrared oven, both the solder paste 22 and the solder drop 24 will melt. When the solder paste 22 is melted, the upper tail section 14b is soldered to the golden finger 21, while the molten solder drop 24 will flow downwardly and electrically contact the lower tail section 15b. Since SMT is performed on both sides of the PCB in a single process, the conventional problem is effectively resolved.

Figure 3:
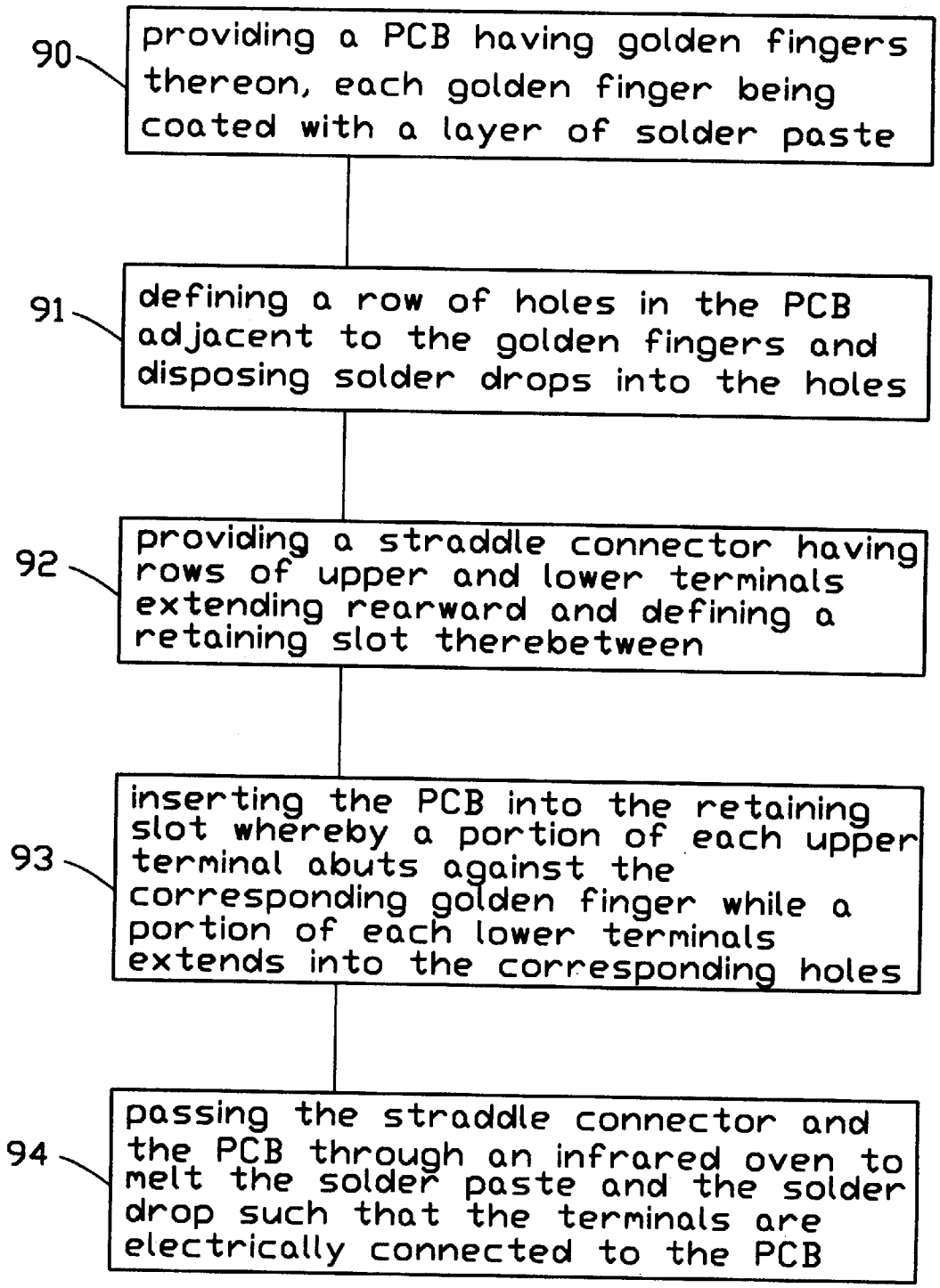
FIG. 3 is a flow chart of a process for conducting an SMT process on two sides of a PCB.

Referring to FIG. 3, a flow chart of a method for conducting an SMT process on both sides of a PCB in accordance with the present invention is shown. The method includes Step 90: providing a PCB having golden fingers thereon, each golden finger being coated with a layer of solder paste. Step 91: defining a row of holes in the PCB adjacent to said golden fingers and disposing solder drops into the holes. Step 92: providing a straddle connector having rows of upper and lower terminals extending rearward and defining a retaining slot therebetween. Step 93: inserting the PCB into the retaining slot whereby a portion of each upper terminal abuts against the corresponding golden finger while a portion of each lower terminal extends into the corresponding hole. Step 94: passing the straddle connector and the PCB through an infrared oven to melt the solder paste and the solder drop whereby the terminals are electrically connected to the PCB.

The feature of the invention includes a hole extending through the PC board and a solder drop provided on the top of and partially within the hole wherein a contact of a component (for example, a connector) which is designed to be mounted to the bottom surface of the PC board, is located on the bottom of the hole and somewhat blocks the hole, so that the melted solder drop may move downward through its own gravity and is stopped by the contact under the hole for mechanically and electrically connecting to said contact.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

We claim:

1. A connector assembly comprising:

a straddle connector including a dielectric housing, said housing having a front face forming an island section and a rear face opposite said island section;

upper and lower terminals embedded within said housing in upper and lower rows, respectively, each terminal including a connecting section extending to said island section and a tail section extending beyond said rear face, a retaining slot being defined between upper and lower rows of tail sections, each tail section of said lower terminals having a rearward extension; and a PCB inserted into said retaining slot between said upper and lower rows of tail sections, said PCB having a row of golden fingers on an upper face thereof, said golden fingers being coated with solder paste and in electrical connection with tail sections of said upper terminals, said tail sections of said upper terminals being located on the solder paste, a row of holes being defined through the PCB adjacent to said golden fingers, said rearward extension of said tail section of each of said lower terminals having a portion being located at a lower end of a corresponding hole, a solder drop being disposed in an upper end of the corresponding hole, said solder drop being meltable under heat to thereby electrically connect the PCB and the corresponding lower terminal.

2. A method for performing an SMT process on two sides of a PCB, comprising the steps of:

a) providing the PCB having golden fingers thereon, each golden finger being coated with a layer of solder paste;

b) defining a row of holes in the PCB adjacent to said golden fingers and disposing solder drops into said holes;

c) providing a straddle connector having rows of upper and lower terminals extending rearwardly and defining a retaining slot therebetween;

d) inserting said PCB into said retaining slot whereby a portion of each said upper terminal abuts against a corresponding golden finger while a portion of each said lower terminal extends into a bottom end of a corresponding hole; and e) passing said straddle connector and said PCB through an infrared oven to melt said solder paste and said solder drops to cause the drops to flow downwardly in the holes to engage with the lower terminals whereby said upper and lower terminals are electrically connected to said PCB.

3. An electrical assembly including:

a PC board including a top surface and a bottom surface and defining a hole extending therethrough;

a solder drop disposed in a top portion of the hole;

a component including at least a contact extending on the bottom surface of the PC board; wherein said contact is positioned under the hole and substantially blocks the hole, so that when the PC board is heated, the solder drop is melted and moves downward along the hole by the force of gravity, and is stopped by the contact and is thereby electrically and mechanically connected to said contact.

4. A method for soldering a component to a bottom surface of a PC board, the steps comprising:

providing the PC board with a top surface and the bottom surface, and a hole extending through said top surface and said bottom surface;

disposing a solder drop on a top portion of the hole;

providing the component with at least a contact located on the bottom surface and under said hole;

heating the PC board and the associated component to melt the solder drop so that the melted solder drop may move along the hole until the solder drop confronts the contact; and solidifying said melted solder drop to mechanically and electrically connect to the contact, thus securing the component to the PC board.

5. A PC board assembly including a PC board with a top surface and a bottom surface thereon, a hole extending through said top surface and said bottom surface, and a solder drop being disposed in a top portion of the hole, said solder drop being melted and downwardly moving by gravity to engage with an electrical component at a bottom of the hole when said PC board is passed through an infrared oven.

* * * * *